United States Patent
Chun et al.

(10) Patent No.: US 9,613,667 B2
(45) Date of Patent: Apr. 4, 2017

(54) DATA STORAGE DEVICE AND OPERATING METHOD THEREOF

(71) Applicant: SK hynix Inc., Gyeonggi-do (KR)

(72) Inventors: Dong Yeob Chun, Gyeonggi-do (KR); Re Sen Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 58 days.

(21) Appl. No.: 14/505,082

(22) Filed: Oct. 2, 2014

(65) Prior Publication Data
US 2015/0380066 A1    Dec. 31, 2015

(30) Foreign Application Priority Data
Jun. 30, 2014    (KR) .................. 10-2014-0080993

(51) Int. Cl.
| | |
|---|---|
| *G06F 1/14* | (2006.01) |
| *G06F 11/263* | (2006.01) |
| *G11C 7/22* | (2006.01) |
| *G11C 7/10* | (2006.01) |

(52) U.S. Cl.
CPC .............. *G11C 7/22* (2013.01); *G11C 7/109* (2013.01)

(58) Field of Classification Search
CPC ...... G06F 3/038; G06F 3/0659; G06F 9/3836; G06F 9/30152; G06F 9/382; G06F 3/017; G06F 15/17; G06F 11/3041; G06F 11/3051; G06F 17/30011; G06F 1/1683; G06F 21/6218; G06F 2205/067; G06F 3/01; G06F 1/3225; G06F 3/0629; G06F 17/5031; G06F 1/022; G06F 17/2775; G06F 2217/84

See application file for complete search history.

(56) References Cited

U.S. PATENT DOCUMENTS

| | | | | |
|---|---|---|---|---|
| 6,041,405 A | * | 3/2000 | Green ............... | G06F 9/30152 712/210 |
| 2004/0098549 A1 | * | 5/2004 | Dorst ............... | G06F 13/1694 711/167 |
| 2007/0118682 A1 | | 5/2007 | Zhang et al. | |
| 2012/0326738 A1 | * | 12/2012 | Kim ............... | G01R 31/318371 324/750.01 |

OTHER PUBLICATIONS

Mike James, Finite State Machines, Oct. 7, 2012.*

* cited by examiner

*Primary Examiner* — David X Yi
*Assistant Examiner* — Candice Rankin
(74) *Attorney, Agent, or Firm* — IP & T Group LLP

(57) ABSTRACT

A data storage device includes a memory device suitable to perform an internal operation; a processor suitable to generate command generation information to command performance of the internal operation; and a command set processing block suitable to generate a command set, which is provided to the memory device, based on the command generation information, wherein the command set processing block generates a final sequence which configures a pattern included in the command set.

14 Claims, 6 Drawing Sheets

DATA STORAGE DEVICE AND OPERATING METHOD THEREOF

CROSS-REFERENCES TO RELATED APPLICATION

The present application claims priority under 35 U.S.C. §119(a) to Korean application number 10-2014-0080993, filed on Jun. 30, 2014, in the Korean Intellectual Property Office, which is herein incorporated by reference in its entirety.

BACKGROUND

1. Technical Field

Various embodiments generally relate to a data storage device, and more particularly, to command set generation of a data storage device.

2. Related Art

Integrated circuits such as semiconductor-based electronic devices are used in a variety of application, including semiconductor memories. There are two types of semiconductor memories: a nonvolatile type and a volatile type.

In a nonvolatile memory device, stored data may be retained even without a power supply. Nonvolatile memory devices include, for example, flash memory devices, FeRAM (ferroelectric random access memory) devices, PCRAM (phase change random access memory) devices, MRAM (magnetic random access memory) devices, and ReRAM (resistive random access memory) devices.

The nonvolatile memory device may be used in a system which requires permanent data retention. For example, the nonvolatile memory device may be used in a digital camera to permanently store images. For another example, the nonvolatile memory device may be used in a digital audio player to permanently store audio data.

SUMMARY

In an embodiment, a data storage device may include: a memory device suitable to perform an internal operation; a processor suitable to generate command generation information to command performance of the internal operation; and a command set processing block suitable to generate a command set, which is provided to the memory device, based on the command generation information, wherein the command set processing block generates a final sequence which configures a pattern included in the command set.

In an embodiment, an operating method of a data storage device may include: receiving command generation information which commands generation of a command set; and generating a final sequence, which configures a pattern included in the command set, based on the command generation information.

DETAILED DESCRIPTION

A data storage device and an operating method thereof will be described below with reference to the accompanying drawings through various embodiments.

Figure 1:
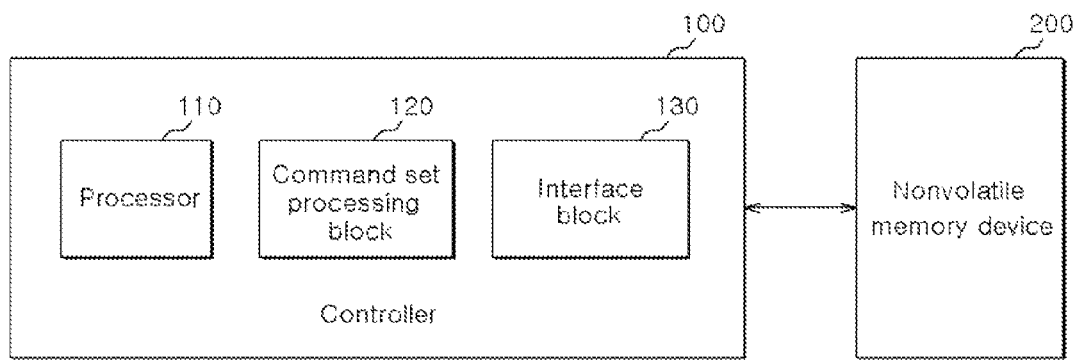
FIG. 1 is a block diagram schematically showing a data storage device in accordance with an embodiment.

FIG. 1 is a block diagram schematically showing a data storage device 10 in accordance with an embodiment.

The data storage device 10 may be configured to store data provided from an external device (not shown), in response to a write request from the external device. Also, the data storage device 10 may be configured to provide stored data to the external device, response to a read request from the external device.

The data storage device 10 may be configured by a Personal Computer Memory Card International Association (PCMCIA) card, a compact flash (CF) card, a smart media card, a memory stick, a multimedia card in the form of multimedia card (MMC), an embedded MMC (eMMC), a reduced-size MMC (RS-MMC) and a micro-MMC, a secure digital card in the form of secure digital (SD) memory card, a mini-SD and a micro-SD, a universal flash storage (UFS), a solid state drive, etc.

The data storage device 10 may include a controller 100 and a memory device 200.

The controller 100 may control general operations of the data storage device 10. The controller 100 may control various internal operations, such as write, read and erase operations, of the memory device 200. The controller 100 may generate, as a command set, a combination of a plurality of signals for commanding the memory device 200 to perform an internal operation. The controller 100 may transmit the generated command set to the memory device 200 through an interface block 130.

The memory device 200 may be nonvolatile and may retain data even when power is off. The memory device 200 may perform an internal operation in response to the command set transmitted from the controller 100. For example, the memory device 200 may perform a write operation in response to a write command set. The memory device 200 may perform a read operation in response to a read command set.

A command set may be configured by various patterns. The respective patterns may be configured by sequences of a plurality of signals. Types of patterns may include, for example, a command pattern, an address pattern, a data input pattern, a data output pattern, and a delay pattern. A command sequence configuring the command pattern may control the memory device 200 to perform a specified internal operation. An address sequence configuring the address pattern may control the memory device 200 to access a specified storage region. A data input sequence configuring the data input pattern may control the memory device 200 to receive data. A data output sequence configuring the data output pattern may control the memory device 200 to output data. A delay sequence configuring the delay pattern may form a time interval between different patterns.

According to the type of internal operation, which is commanded to the memory device 200 by the controller 100, the command set may or may not include a given pattern. In another embodiment, the command set may include two or more of the given patterns.

Figure 2:
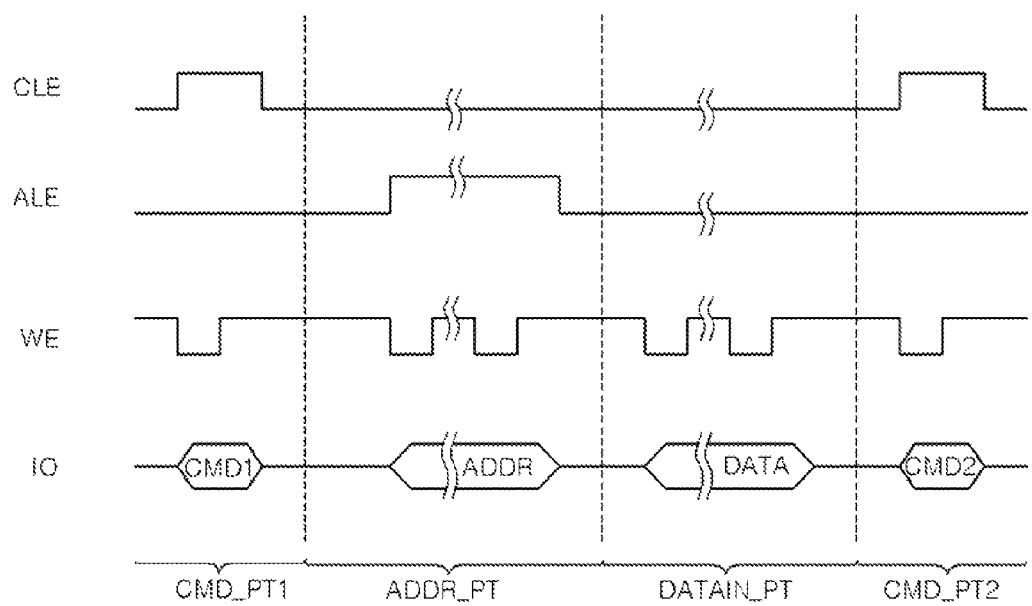
FIG. 2 is a waveform diagram showing a command set which is inputted to the memory device shown in FIG. 1.

FIG. 2 is a waveform diagram showing a command set which is inputted to the memory device 200 shown in FIG. 1. For example, the command set may include a write command set WRITE_CMD_SET for commanding a write operation. The write command set WRITE_CMD_SET may be defined according to the specifications of the memory device 200. The write command set WRITE_CMD_SET may be generated by the controller 100 and may be transmitted to the memory device 200.

The write command set WRITE_CMD_SET may be configured with a combination of a plurality of signals. For example, the write command set WRITE_CMD_SET may be configured with a combination of a command latch enable signal CLE, an address latch enable signal ALE, a write enable signal WE, and an input/output pin transmission signal IO. The command latch enable signal CLE may be enabled when the input/output pin transmission signal IO is a command. The address latch enable signal ALE may be enabled when the input/output pin transmission signal IO is an address. The write enable signal WE may be enabled to latch the input/output pin transmission signal IO. The input/output pin transmission signal IO may include first and second commands CMD1 and CMD2, an address ADDR and data DATA.

The write command set WRITE_CMD_SET may be configured by command patterns CMD_PT1 and CMD_PT2, an address pattern ADDR_PT, and a data input pattern DATAIN_PT. Each of the patterns may be configured by a sequence of the command latch enable signal CLE, the address latch enable signal ALE, the write enable signal WE, and the input/output pin transmission signal IO.

Referring back to FIG. 1, the controller 100 may include a processor 110, a command set processing block 120, and the interface block 130.

The processor 110 may control operation of the blocks 120 and 130 included in the controller 100. The processor 110 may provide command generation information to the command set processing block 120 such that a command set is generated and provided to the memory device 200.

Figure 3A:
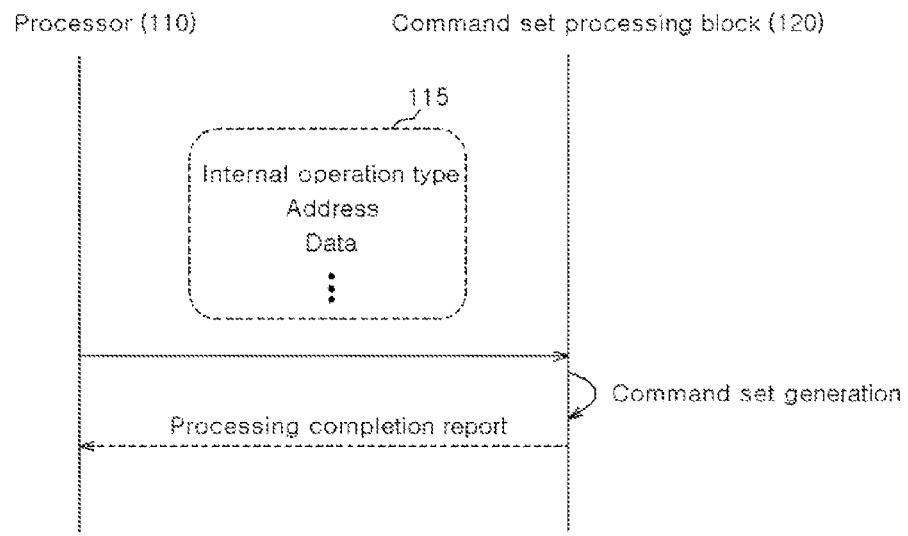
FIGS. 3A and 3B are diagrams showing a method by which a processor provides command generation information to a command set processing block.

FIGS. 3A and 38 are diagrams showing a method by which the processor 110 provides the command generation information to the command set processing block 120.

The command generation information may include, example, information on the type of internal operation which is performed by the memory device 200, information on addresses of storage regions in which the internal operation is performed, information on data which is to be written, and information on the size of the data which is to be written or read. The respective patterns configuring a command set may be generated based on the command generation information provided. For example, a command pattern may be different depending on the type of internal operation. An address pattern may be generated based on address information received. A data input pattern may be generated based on data which is to be written and the size of the data which is to be written. A data output pattern may be generated based on the size of data which is to be read.

Referring to FIG. 3A, the processor 110 may provide command generation information 115 to the command set processing block 120 only once. The command set processing block 120 may s generate final sequences forming of a command set, based on the command generation information 115, and may then report processing completion to the processor 110.

Figure 3B:
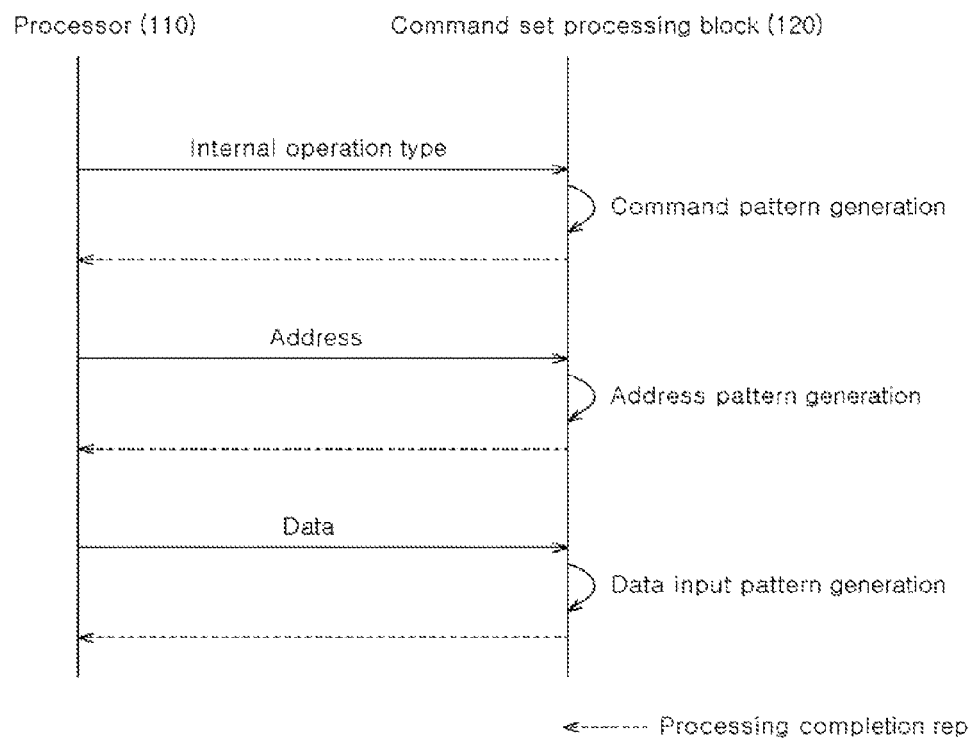

Referring to FIG. 3B, the processor 110 may provide command generation information to the command set processing block 120 in a divided manner. That is, the command generation information may be divided pattern by pattern and the divided information may be provided to the command set processing block 120 sequentially, simultaneously, or in a pipeline. The command set processing block 120 may generate patterns corresponding to the command generation information, and may then report processing completion to the processor 110.

For example, in FIG. 3B, the unit information is provided from the processor 110 to the command set processing block 120 in a sequential manner. For example, the processor 110 may provide information on the type of internal operation to the command set processing block 120. The command set processing block 120 may generate a command pattern based on the provided information on the type of internal operation, and may then report processing completion to the processor 110. The processor 110 may provide an address to the command set processing block 120 after receiving the processing completion report from the command set processing block 120. The command set processing block 120 may generate an address pattern based on the provided address, and may then report processing completion to the processor 110. The processor 110 may provide the command set processing block 120 with data which is to be written after receiving the processing completion report from the command set processing block 120. The command set processing block 120 may generate a data input pattern based on the provided data, and may then report processing completion to the processor 110.

Referring again to FIG. 1, the command set processing block 120 may generate sequences, which are respectively correspond to the patterns configuring the command set, based on the command generation information provided from the processor 110. The command set processing block 120 may generate the command set pattern by pattern. In the case where the command set processing block 120 receives the command generation information on all patterns at the same time from the processor 110, the command set processing block 120 may report processing completion to the processor 110 after completion of generating the command set. See FIG. 3A. In the case where the command set processing block 120 receives the command generation information in a divided manner, e.g., pattern by pattern, from the processor 110, the command set processing block 120 may report processing completion to the processor 110 every time after completion of generating respective patterns.

The command set processing block 120 may generate an appropriate command set according to an interfacing scheme of the interface block 130. In the case where the interface block 130 transmits the command set generated by the command set processing block 120 to the memory device 200 as it is, the command set processing block 120 may generate the command set in a form compatible with specifications of the memory device 200. In the case where the interface block 130 transmits the generated command set to the memory device 200 through a specified physical layer structure (hereinafter, referred to as "PHY") (not shown), the command set processing block 120 may generate the command set in a form compatible with specifications of the specified PHY.

The interface block 130 may interface the controller 100 and the memory device 200. The interface block 130 may transmit the command set generated by the command set processing block 120 to the memory device 200. In the case where the interface block 130 includes a PHY for high speed interfacing with the memory device 200, the interface block 130 may convert the command set compatible with the specifications of the PHY, which is generated by the command set processing block 120, into a command set compatible with the specifications of the memory device 200. The command sets obtained before and after the conversion by the interface block 130 may be configured by substantially the same patterns.

Figure 4:
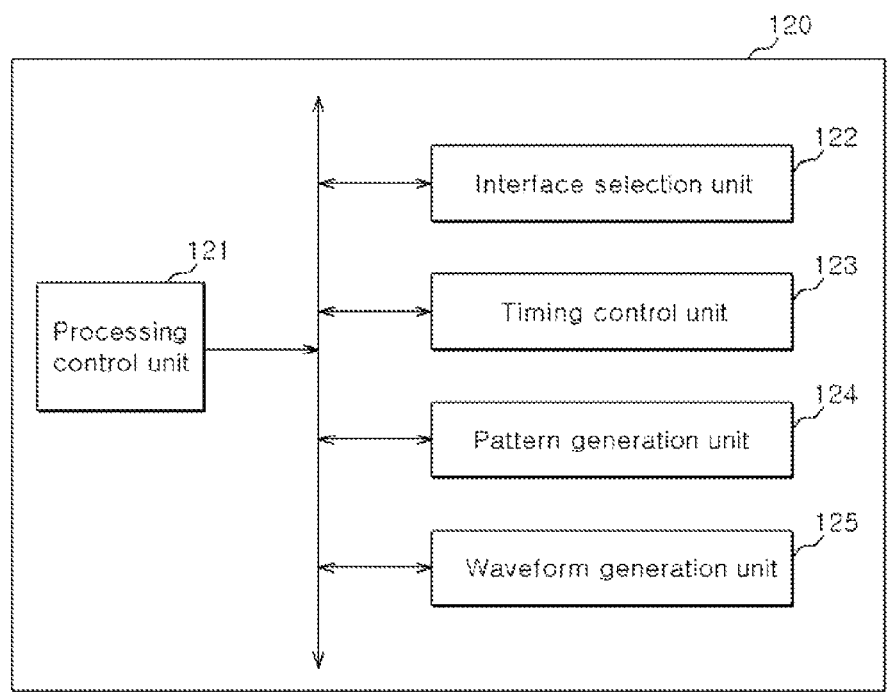
FIG. 4 is a block diagram showing the command set processing block shown in FIG. 1.

FIG. 4 is a block diagram showing the command set processing block 120 shown in FIG. 1.

The command set processing block 120 may include a processing control unit 121, an interface selection unit 122, a timing control unit 123, a pattern generation unit 124, and a waveform generation unit 125.

The processing control unit 121 may control the units 122, 123, 124 and 125 such that final sequences configuring a command set is generated based on the command generation information provided from the processor 110. The processing control unit 121 may determine pattern types, by which the command set is configured, based on the command generation information, and may control the pattern generation unit 124 according to a determination result. In the case where the processing control unit 121 receives the command generation information in a divided manner, e.g., pattern by pattern, the processing control unit 121 may control the pattern generation unit 124 such that corresponding pattern types are generated. According to an embodiment, the processing control unit 121 may report processing completion to the processor 110 after generating the command set. According to another embodiment, the processing control unit 121 may report processing completion to the processor 110 after generating respective patterns configuring the command set.

The interface selection unit 122 may detect interfacing schemes of the interface block 130 and the memory device 200. For example, the interface selection unit 122 may detect whether the interface block 130 communicates with the memory device 200 through a specified PHY or directly communicates with the memory device 200. The interface selection unit 122 may detect the type of interface that the memory device 200 supports or a manufacturer of the memory device 200. The interface selection unit 122 may provide a detection result to other units 123, 124 and 125 as interface information. The command set processing block 120 may generate an appropriate command set based on the detection result which is obtained by the interface selection unit 122 according to the interfacing schemes of the interface block 130 and the memory device 200.

The timing control unit 123 may generate information (hereinafter, referred to as "timing information") on enable timing or disable timing of signals configuring the command set, based on operational characteristics of the memory device 200, for example, timing parameters and an operation frequency of the memory device 200. The timing parameters defined in view of the specifications of the memory device 200 may be detected as interface information by the interface selection unit 122 and may be provided to the timing control unit 123. The timing parameters may include, for example, a setup time, a hold time, a pulse width, and a delay time.

The pattern generation unit 124 may generate base sequences corresponding to the respective patterns configuring the command set, based on the timing information transmitted from the timing control unit 123 and the interface information provided from the interface selection unit 122. The pattern generation unit 124 may generate base sequences corresponding to patterns which are generated in response to commands from the processing control unit 121. The pattern generation unit 124 may be configured by finite state machines. The pattern generation unit 124 may provide the generated base sequences to the waveform generation unit 125.

The waveform generation unit 125 may generate final sequences configuring corresponding patterns based on the base sequences which are provided pattern by pattern from the pattern generation unit 124. The waveform generation unit 125 may generate the final sequences which are configured by signals compatible with the interfacing scheme of the interface block 130 and the memory device 200, based on the interface information provided from the interface selection unit 122. The final sequences, which configure respective patterns and are generated by the waveform generation unit 125, may be combined to collectively form the command set.

Figure 5:
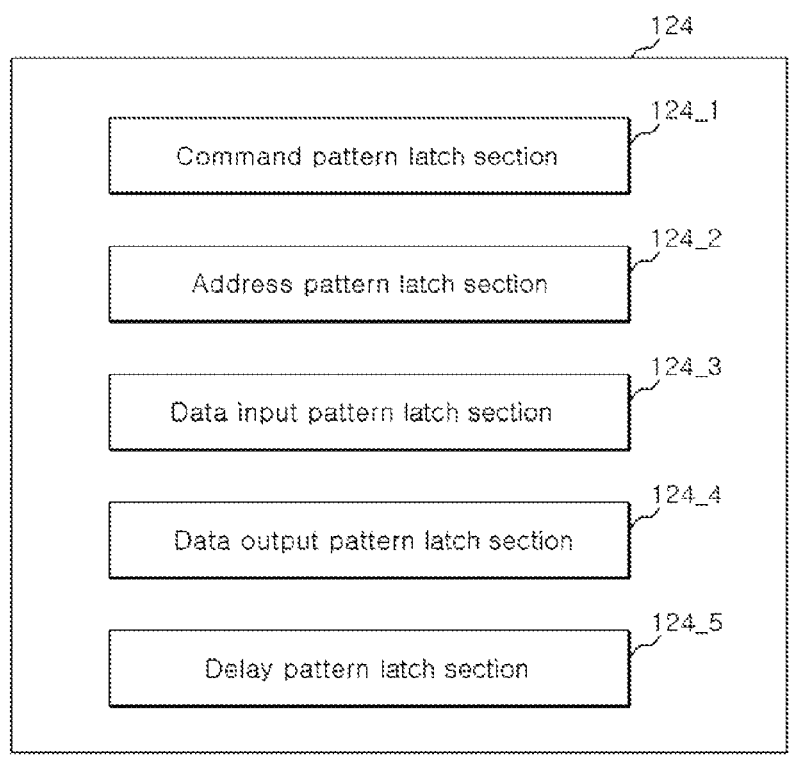
FIG. 5 is a block diagram showing the pattern generation unit shown in FIG. 4.

FIG. 5 is a block diagram showing the pattern generation unit 124 shown in FIG. 4.

The pattern generation unit 124 may include a command pattern latch section 124_1, an address pattern latch section 124_2, a data input pattern latch section 124_3, a data output pattern latch section 124_4, and a delay pattern latch section 124_5. The respective latch sections 124_1, 124_2, 124_3, 124_4 and 124_5 may be configured by finite state machines.

The respective latch sections 124_1, 124_2, 124_3, 124_4 and 124_5 may generate portions of base sequences, which are corresponding to respective patterns, based on the timing information under the control of the processing control unit 121. The command pattern latch section 124_1 may generate a base sequence for a command pattern. The address pattern latch section 124_2 may generate a base sequence for an address pattern. The data input pattern latch section 124_3 may generate a base sequence for a data input pattern. A data output pattern latch section 124_4 may generate a base sequence for a data output pattern. The delay pattern latch section 124_5 may generate a base sequence for a delay pattern.

Figure 6:
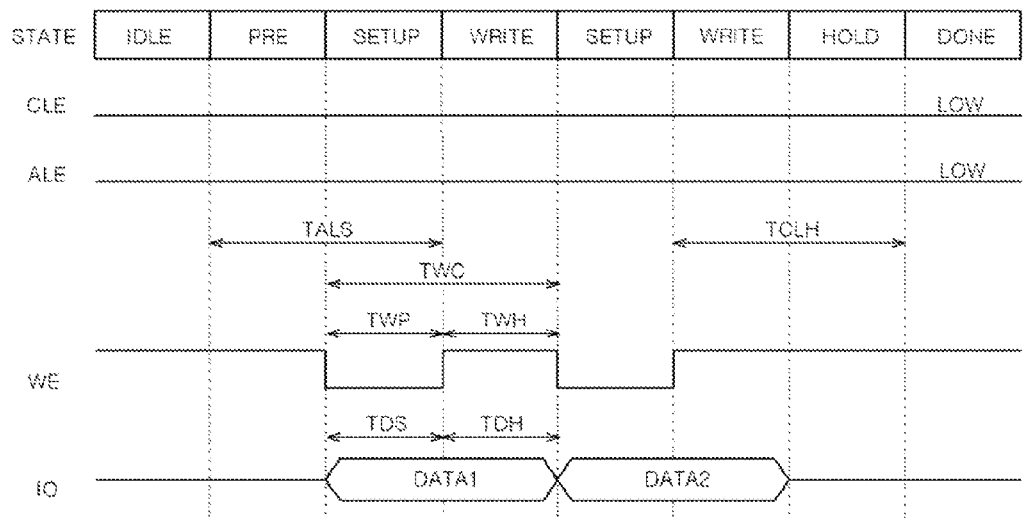
FIG. 6 is a waveform diagram explaining an operating method of the data input pattern latch section shown in FIG. 5 and the waveform generation unit shown in FIG. 4.

FIG. 6 is a waveform diagram explaining an operating method of the data input pattern latch section 124_3 shown in FIG. 5 and the waveform generation unit 125 shown in FIG. 4. FIG. 6 shows state signals STATE which are generated by the data input pattern latch section 124_3 and a final sequence, which configures the data input pattern, generated by the waveform generation unit 125 based on the state signals STATE. The final sequence, which configures the data input pattern, may be configured by, for example, a combination of the command latch enable signal CLE, the address latch enable signal ALE, the write enable signal WE and the input/output pin transmission signal IO. The other latch sections 124_1, 124_2, 124_4 and 124_5 shown in FIG. 5 may operate similarly to the data input pattern latch section 124_3. In FIG. 6, it is assumed that the interface block 130 does not include a specified PHY and the command set processing block 120 generates a command set compatible with specifications of the memory device 200.

The data input pattern latch section 124_3 may include a finite state machine. The base sequence generated by the data input pattern latch section 124_3 may include a plurality of state signals STATE. The state signals STATE may respectively correspond to an idle state IDLE, a pre state PRE, a setup state SETUP, a write state WRITE, a hold state HOLD, a post state POST and a done state DONE, and may be respectively enabled when the corresponding states are retained.

The data input pattern latch section 124_3 may be in the idle state IDLE when receiving a base sequence generation command from the processing control unit 121. In this case, the signal corresponding to the idle state IDLE may be enabled.

The data input pattern latch section 124_3 may convert and retain states, based on the timing information of the memory device 200 transmitted from the timing control unit 123. For example, the data input pattern latch section 124_3 may retain the pre state PRE and the setup state SETUP, based on timing information for an address latch enable setup time TALS. The data input pattern latch section 124_3 may retain the setup state SETUP, based on timing information for a write enable pulse time TVP and a data setup time TDS. The data input pattern latch section 124_3 may retain the write state WRITE, based on timing information for a write enable hold time TWH and a data hold time TDH. The data input pattern latch section 124_3 may retain the setup state SETUP and the write state WRITE, based on timing information for a write cycle time TWC. The data input pattern latch section 124_3 may retain the write state WRITE and the hold state HOLD, based on timing information for a command latch enable hold time TCLH. The data input pattern latch section 124_3 may respectively enable state signals corresponding to retained states.

The data input pattern latch section 124_3 may enter the done state DONE when the generation of the base sequence is done. In this case, a signal corresponding to the done state DONE may be enabled.

The waveform generation unit 125 may perform a logic calculation for the state signals STATE of the base sequence to generate a final sequence which configures a data input pattern. For example, the waveform generation unit 125 may generate the write enable signal WE based on a signal corresponding to the setup state SETUP. The waveform generation unit 125 may generate the input/output pin transmission signal IO which is configured by data DATA1 and DATA2 based on signal's respectively corresponding to the setup state SETUP and the write state WRITE.

Figure 7:
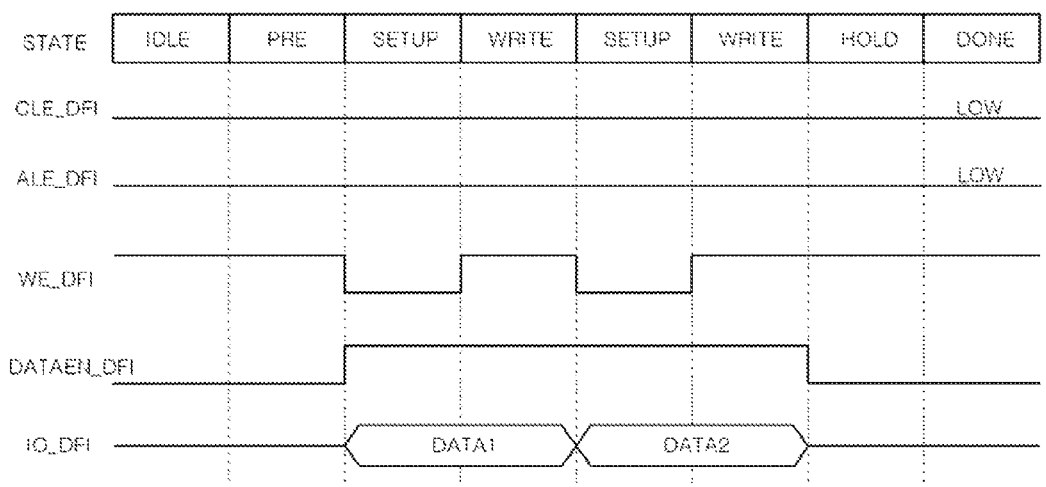
FIG. 7 is a waveform diagram explaining an another operating method of the data input pattern latch section shown in FIG. 5 and the waveform generation unit shown in FIG. 4.

FIG. 7 is a waveform diagram explaining another operating method of the data input pattern latch section 124_3 shown in FIG. 5 and the waveform generation unit 125 shown in FIG. 4. In FIG. 7, it is assumed that that the interface block 130 includes a specified PHY and the command set processing block 120 generates a command set compatible with the specification of the specified PHY.

A final sequence configuring a data input pattern, shown in FIG. 7, may be generated by substantially the same operating method as the operating method described above with reference to FIG. 6, except that the final sequence is configured by signals compatible with specifications of the specified PHY. The final sequence configuring a data input pattern may be configured by a combination of a PHY command latch enable signal CLE_DFI, a PHY address latch enable signal ALE_DFI, a PHY write enable signal WE_DFI, a data enable signal DATAEN_DFI and a data signal IO_DFI.

Figure 8:
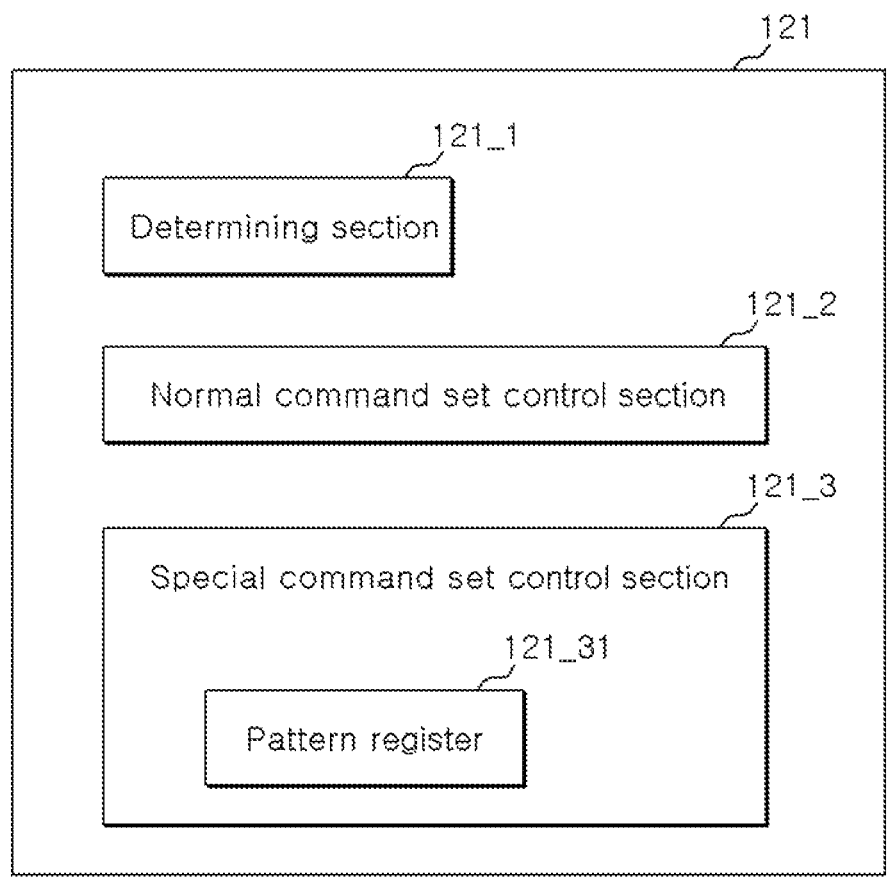
FIG. 8 is a block diagram showing the processing control unit shown in FIG. 4.

FIG. 8 is a block diagram showing an example of the processing control unit 121 shown in FIG. 4.

An internal operation of the memory device 200 may be divided into a normal type and a special type according to the number of times of providing a command set necessary to command the performance of the internal operation. The memory device 200 which performs a normal internal operation may be controlled by a command set which is provided one time. The normal internal operation may include, for example, a write operation, a read operation, an erase operation and a reset operation. The memory device 200 which performs a special internal operation may be controlled by a command set which is provided one time or more. The special internal operation may include, for example, a read status operation, a set parameter operation, a get parameter operation, a random read operation and a random write operation.

Referring to FIG. 8, the processing control unit 121 may include a determining section 121_1, a normal command set control section 121_2, and a special command set control section 121_3.

The determining section 121_1 may determine the type of internal operation to be performed by the memory device 200, based on the command generation information provided from the processor 110. The determining section 121_1 may determine whether a normal internal operation is commanded or a special internal operation is commanded to the memory device 200, based on the command generation information.

The normal command set control section 121_2 may control a series of processes for generating and processing a command set (hereinafter, referred to as a "normal command set") corresponding to the normal internal operation in the case where it is determined by the determining section 121_1 that the normal internal operation is commanded. The normal command set control section 121_2 may determine pattern types, by which the normal command set is configured, based on the command generation information and may control the pattern generation unit 124 according to a determination result. In the case where the normal command set control section 121_2 is provided with the command generation information, which is divided pattern by pattern, from the processor 110, the normal command set control section 121_2 may control the pattern generation unit 124 such that corresponding pattern types are generated.

The special command set control section 121_3 may control a series of processes for generating and processing a command set (hereinafter, referred to as a "special command set") corresponding to the special internal operation in the case where it is determined by the determining section 121_1 that the special internal operation is commanded. The special command set control section 121_3 may determine pattern types, by which the special command set is configured, based on the command generation information, and may control the pattern generation unit 124 according to a determination result. The special command set control section 121_3 may determine independently from and without a control from the processor 110, whether additional generation of a special command set is needed after an initial generation of a special command set. The special command set control section 121_3 may determine pattern types, by which a special command set additionally generated is to be configured, by referring to a pattern register 121_31, and may control the pattern generation unit 124 according to a determination result.

The pattern register 121_31 may store information of patterns which configure a special command set to be additionally generated. The pattern register 121_31 may store the configurations and orders of patterns for various respective special command sets.

Figure 9:
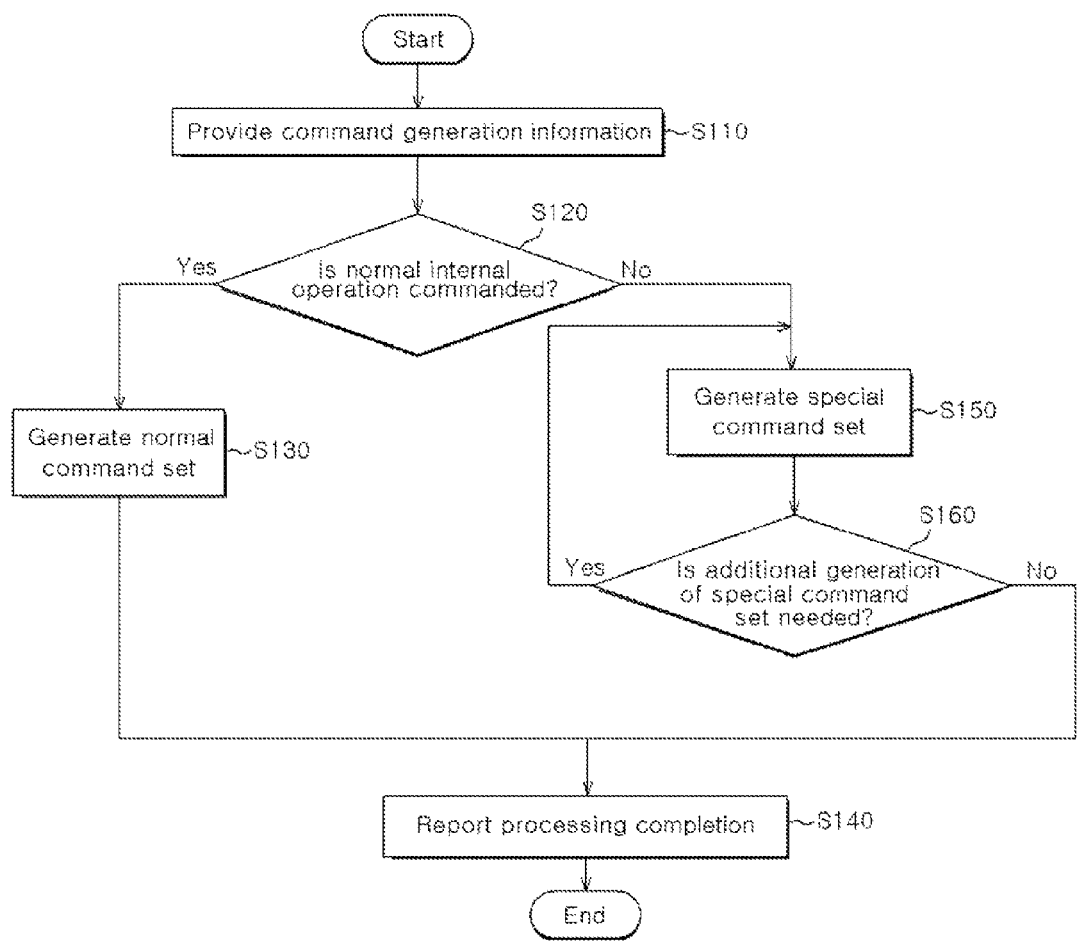
FIG. 9 is a flow chart explaining a process of generating a normal or special command set using the command set processing block including the processing control unit shown in FIG. 8.

FIG. 9 is a flow chart explaining an example of a process for the command set processing block 120 including the processing control unit 121 which is shown in FIG. 8 and generates a normal or special command set.

At step S110, the command set processing block 120 may be provided with command generation information from the processor 110.

At step S120, the determining section 121_1 may determine whether a normal internal operation is commanded to the memory device 200, based on the provided command generation information. In the case where it is determined that a normal internal operation is commanded (Yes), the process may proceed to step S130. In the case where it is determined that a normal internal operation is not commanded (No), that is, in the case where it is determined that a special internal operation is commanded, the process may proceed to step S150.

At the step S130, the command set processing block 120 may generate a normal command set. The normal command set control section 121_2 may determine pattern types, by which a normal command set is to be configured, based on the command generation information, and may control the pattern generation unit 124 according to a determination result.

At step S140, the command set processing block 120 may report processing completion of generation of the normal command set to the processor 110.

At the step 5150, the command set processing block 120 may generate a special command set. The special command set control section 121_3 may determine pattern types, by which a special command set is to be configured, based on the command generation information, and may control the pattern generation unit 124 according to a determination result.

At step S160, the command set processing block 120 may determine whether additional generation of a special command set is needed. For example, in the case where a special command set for commanding a read status operation to the memory device 200 is initially generated and transmitted, the special command set control section 121_3 may determine whether to additionally generate a special command set, according to a ready or busy response of the memory device 200. In the case where the response of the memory device 200 is busy, the special command set control section 121_3 may determine that additional generation of a special command set is needed (Yes), and the process may proceed to the step S150. At the step S150, the special command set control section 121_3 may additionally generate the special command set by referring to the pattern information stored in the pattern register 121_31 independently from and without a control from the processor 110. In the case where the response of the memory device 200 is ready, the special command set control section 121_3 may determine that additional generation of the special command set is not needed (No), and the process may proceed to the step S140. The command set processing block 120 does not generate the special command set any more, and may report processing completion of the special command set to the processor 110.

As is apparent from the above descriptions, the data storage device according to an embodiment may include a command set processing block for generating a command set to be provided to a memory device, While various embodiments have been described above, it will be understood that the embodiments described are for example only. Accordingly, the data storage device and the operating method thereof described herein should not be construed as limitative.

What is claimed is:

1. A data storage device comprising:
   a memory device suitable to perform an internal operation in response to a command set;
   a processor suitable to generate command generation information for the command set; and
   a command set processing block suitable to determine at least one pattern based on the command generation information, generate at least one base sequence corresponding to the pattern, and generate the command set based on the base sequence, wherein the base sequence is configured by a plurality of signals,
   wherein the command set processing block includes:
   a finite state machine suitable to generate the plurality of signals by performing state transition between a plurality of states corresponding to the plurality of signals based on timing information and enabling only a signal corresponding to a current state among the plurality of signals, and
   a waveform generation circuit suitable to generate a final sequence by applying a logic calculation to the base sequence using the plurality of signals and generate the command set based on the final sequence.

2. The data storage device according to claim 1, wherein the pattern comprises a command pattern, an address pattern, a data input pattern, a data output pattern, a delay pattern, or a combination thereof.

3. The data storage device according to claim 1, wherein the command set processing block further comprises:
   a timing control circuit suitable to generate the timing information based on one or more timing parameters and an operation frequency characteristic of the memory device.

4. The data storage device according to claim 1,
   wherein the plurality of signals are respectively enabled based on the timing information.

5. The data storage device according to claim 1, further comprising:
   an interface block suitable to communicate with the memory device,
   wherein the command set processing block comprises:
   an interface selection circuit suitable to detect interfacing schemes of the memory device and the interface block.

6. The data storage device according to claim 1, wherein the command set processing block determines the type of internal operation based on the command generation information, and determines whether additional generation of the command set is needed according to a result of determining the type of internal operation.

7. The data storage device according to claim 6, wherein the command set processing block further comprises a pattern register suitable to store information of the pattern for additional generation of the command set.

8. An operating method of a data storage device, wherein the data storage device includes a command set processing block and a memory device, comprising:
   at the command set processing block, receiving command generation information which commands generation of a command set;

at the command set processing block, determining at least one pattern based on the command generation information;

at the command set processing block, generating at least one base sequence corresponding to the pattern, using a finite state machine, the base sequence being configured by a plurality of signals;

at the command set processing block, generating a final sequence by applying a logic calculation to the base sequence using the plurality of signals;

at the command set processing block, generating the command set based on the final sequence, and at the command set processing block, providing the command set to the memory device to control an internal operation of the memory device, wherein the generating of the base sequence comprises:
performing state transition between a plurality of states corresponding to the plurality of signals based on timing information; and
enabling only a signal corresponding to a current state among the plurality of signals.

9. The operating method according to claim 8, wherein the pattern comprises a command pattern, an address pattern, a data input pattern, a data output pattern, a delay pattern, or a combination thereof.

10. The operating method according to claim 8, further comprising:
at the command set processing block, detecting interfacing schemes of the memory device and an interface block further provided between the command set processing block and the memory,
wherein the interface block is suitable to communicate with the memory device and the command set is generated based on the detected interfacing schemes.

11. The operating method according to claim 8, further comprising:
at the command set processing block, generating the timing information based on one or more timing parameters and an operation frequency characteristic of the memory device.

12. The operating method according to claim 8,
wherein the plurality of signals are respectively enabled based on the timing information.

13. The operating method according to claim 8, further comprising:
at the command set processing block, determining a type of internal operation to be performed in the memory device in response to the command set based on the command generation information; and
at the command set processing block, determining whether additional generation of the command set is needed according to a result of determining the type of internal operation.

14. The operating method according to claim 13, further comprising:
at the command set processing block, additionally generating the command set by referring to a pattern register,
wherein the pattern register stores information of the pattern included in the command set.

* * * * *